United States Patent [19]

Bianco et al.

[11] Patent Number: 5,357,572
[45] Date of Patent: Oct. 18, 1994

[54] APPARATUS AND METHOD FOR SENSITIVE CIRCUIT PROTECTION WITH SET-SCAN TESTING

[75] Inventors: Mark E. Bianco, Pomona; Douglas A. Dwyer; David J. Knobbe, both of Brea; James P. Baukus, Westlake Village; Allan R. Kramer, Simi Valley; Faik S. Ozdemir, Thousand Oaks, all of Calif.

[73] Assignee: Hughes Aircraft Company, Los Angeles, Calif.

[21] Appl. No.: 949,281

[22] Filed: Sep. 22, 1992

[51] Int. Cl.[5] .............................................. H04L 9/00
[52] U.S. Cl. .......................................... 380/23; 380/3; 371/22.3
[58] Field of Search ................ 380/23, 3; 324/158 R; 371/22.3, 22.6, 22.5

[56] References Cited

U.S. PATENT DOCUMENTS

| | | |
|---|---|---|
| 4,139,864 | 2/1979 | Schulman . |
| 4,267,578 | 5/1981 | Vetter . |
| 4,603,381 | 7/1986 | Guttag . |
| 4,833,676 | 5/1989 | Koo ..................... 371/22.3 |
| 5,109,190 | 4/1992 | Sakashita et al. ............. 324/158 R |

*Primary Examiner*—Salvatore Cangialosi
*Attorney, Agent, or Firm*—W. K. Denson-Low

[57] ABSTRACT

A set/scan test capability is provided for a circuit that includes sensitive subcircuits, but that can be latched out to prevent reverse engineering the sensitive elements. A mechanism to inhibit set/scan test access to at least some of the sensitive subcircuits is selectively actuated by a control circuit to override a normal set/scan test and inhibit set/scan access to the sensitive subcircuits. Various implementations are possible, such as fusible-link PROMs for irreversibly inhibiting set/scan access to the sensitive subcircuits after an initial non-inhibited test period, the use of encryption codes to enable repeated set/scan access to the sensitive subcircuits, and an erasable/reprogrammable mechanism for inhibiting set/scan access to programmed sets of subcircuits.

27 Claims, 4 Drawing Sheets

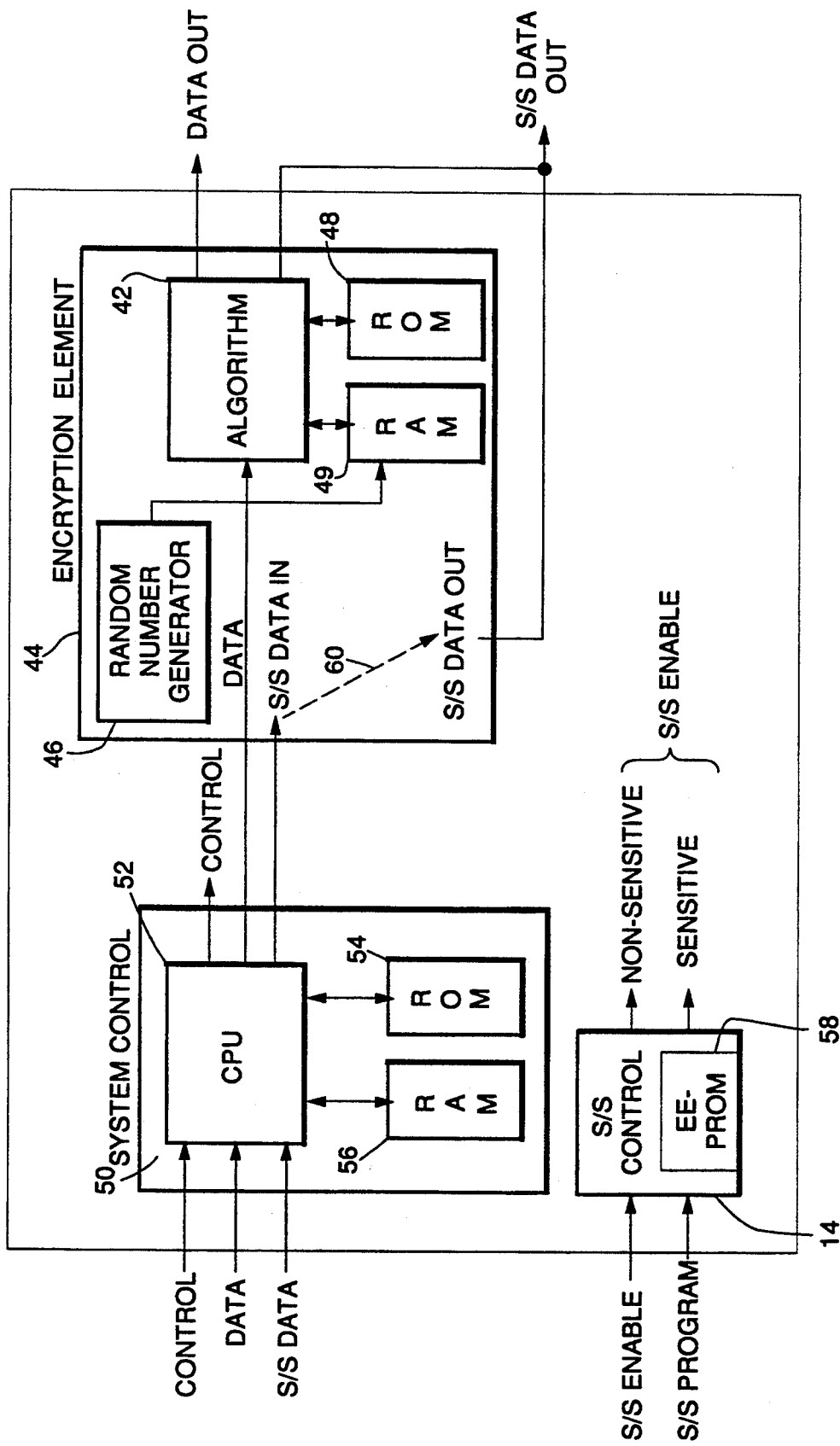

APPARATUS AND METHOD FOR SENSITIVE CIRCUIT PROTECTION WITH SET-SCAN TESTING

BACKGROUND OF THE INVENTION

1. Field of the Invention

This invention relates to the protection of integrated circuitry from reverse engineering, and more particularly to the protection of sensitive portions of integrated circuits (ICs) that have a set/scan test capability.

2. Description of the Related Art

As ICs have become more complex, locating and identifying circuit faults has become more difficult. One technique that is commonly used for this purpose, due to its simplicity and completeness, is referred to as set/scan testing. This technique is described, for example, in Maunder and Tulloss, "Testability on TAP", IEEE Spectrum, February 1992, pages 34-37 (the term "boundary-scan" as used in this article is synonymous with set/scan).

When the set/scan test mode is enabled each flip-flop circuit in the overall IC is connected in series, so that they essentially become a very large shift register. A known pattern is then applied to the circuit to set all of the flip-flops to a known state. In response to one or more clock signals, this pattern is modified by the logic between flip-flops and stored in the next flip-flop in the chain, allowing the resulting bit pattern to be read out of the device. ROM (read only memory) contents can similarly be read to verify their programming. Faulty logic is detected by comparing the output bit pattern to a known-good response, and analyzing the incorrect responses to determine the fault modes (such as fabrication problems, design errors, etc.) that might have caused the error.

The set/scan technique is commonly used in high-density LSI (large scale integration) devices because of its ability to exercise a very high percentage of the circuitry in a time-efficient manner. In addition to supporting manufacturing test, the set/scan functions can later be used by the end equipment to verify that the device is functioning correctly, or by the manufacturer to determine why the device failed in the field.

To achieve the level of observability required to satisfy these needs, every logic element must be exercised. Unfortunately, the level of fault coverage is inversely proportional to the resistance of the device to reverse-engineering attacks. In other words, manufacturers must consider that the more thorough the set/scan capability, the greater the chance that a copyist can discover design details by analyzing a number of corresponding input-output pairs. A tradeoff must therefore be made between faster and more thorough testing versus the amount of design exposure that is considered acceptable.

A thorough set/scan capability includes all of the flip-flops, RAM (random access memory) and ROM cells, and the logic used to connect them. Such circuitry may include sensitive subcircuits which the circuit designer would prefer to secure from reverse engineering. However, the designs of such subcircuits can be determined by considering each one as a "black box" and analyzing the corresponding input-output patterns made available by the set/scan feature. Such an analysis cannot be prevented by the common passive anti-reverse engineering technique of coating the circuit die with an opaque material, since this can only protect the circuit from analysis by visual examination.

Active anti-reverse engineering techniques have been developed, such as that disclosed in Ozdemir et al. U.S. Pat. No. 4,766,516, issued Aug. 23, 1988 and assigned to Hughes Aircraft Company, the assignee of the present invention. In this patent additional circuit elements that do not contribute toward the IC's circuit function, but which inhibit the proper functioning of the IC in case of an attempted copying or unauthorized use, are inserted into the circuit. The identities of the additional circuit elements are disguised by forming them with the visible appearance of an apparent element but with a physical modification that is not readily visible but causes them to function in a different manner, by providing different ICs with unique control codes, or both. However, even techniques such as these cannot provide sufficient protection if a thorough set/scan capability has been implemented. Such protective measures can be circumvented by using the set/scan capability to obtain direct internal access to the IC, including its sensitive subcircuits; analytical techniques can then be used to recover the circuit design. This is the principal reason why set/scan techniques are often avoided when implementing sensitive algorithms, despite the desirability of set/scan as a test procedure.

SUMMARY OF THE INVENTION

The present invention seeks to enhance the testability of ICs that contain sensitive circuitry through the use of the set/scan test technique, while preventing the disclosure of the sensitive circuitry design to unauthorized parties. In so doing the invention allows sensitive subcircuits to be removed from the set/scan test chain. The removal can be permanent, or the sensitive subcircuits can be included in the set/scan chain in response to the application of a control code by an authorized user. The manufacturer is provided with full testability during device fabrication, while access to the sensitive elements can be restricted once the device is delivered; copiers are thereby prevented from exploiting the set/scan capability to obtain design details required for the production of unauthorized copies. The invention is compatible with, and enhances the strength of, other anti-reverse engineering measures such as opaque die coatings or the techniques disclosed in U.S. Pat. No. 4,766,516.

The invention provides for a selectable mechanism to inhibit set/scan test access to at least some of the IC's sensitive subcircuits, and a mechanism for overriding a normal set/scan test by actuating the inhibit mechanism for the sensitive subcircuits while permitting set/scan access to the remaining subcircuits. The security system can be designed so that, in response to an applied control signal, it either irreversibly actuates the set/scan inhibit function, or it reversibly sets an inhibit and employs an access code to reinstall set/scan for the sensitive subcircuits.

Various circuit designs are available to implement the invention. The set/scan inhibit function can either be permanent, or can allow the sensitive subcircuits to be included in the set/scan test chain when a control code known only to authorized parties is externally input to the device. It can be programmable with respect to the sensitive subcircuits to which set/scan access is inhibited, in which case the inhibit program is preferably erasable and reprogrammable. A common line may be used to transmit set/scan inhibit signals to each of the sensitive subcircuits, with an inhibit latch either centrally located or distributed to each of these sensitive subcircuits, or the selection of subcircuits to be inhibited may be programmable. The inhibit function is preferably implemented by diverting a set/scan test signal away from a sensitive subcircuit to a bypass circuit, with set/scan access retained for the non-sensitive subcircuits.

Further features and advantages of the invention will be apparent to those skilled in the art from the following detailed description, taken together with the accompanying drawings.

DESCRIPTION OF THE DRAWINGS

FIG. 6 is a block diagram illustrating an application for the invention.

DETAILED DESCRIPTION OF THE INVENTION

Figures 1, 2:
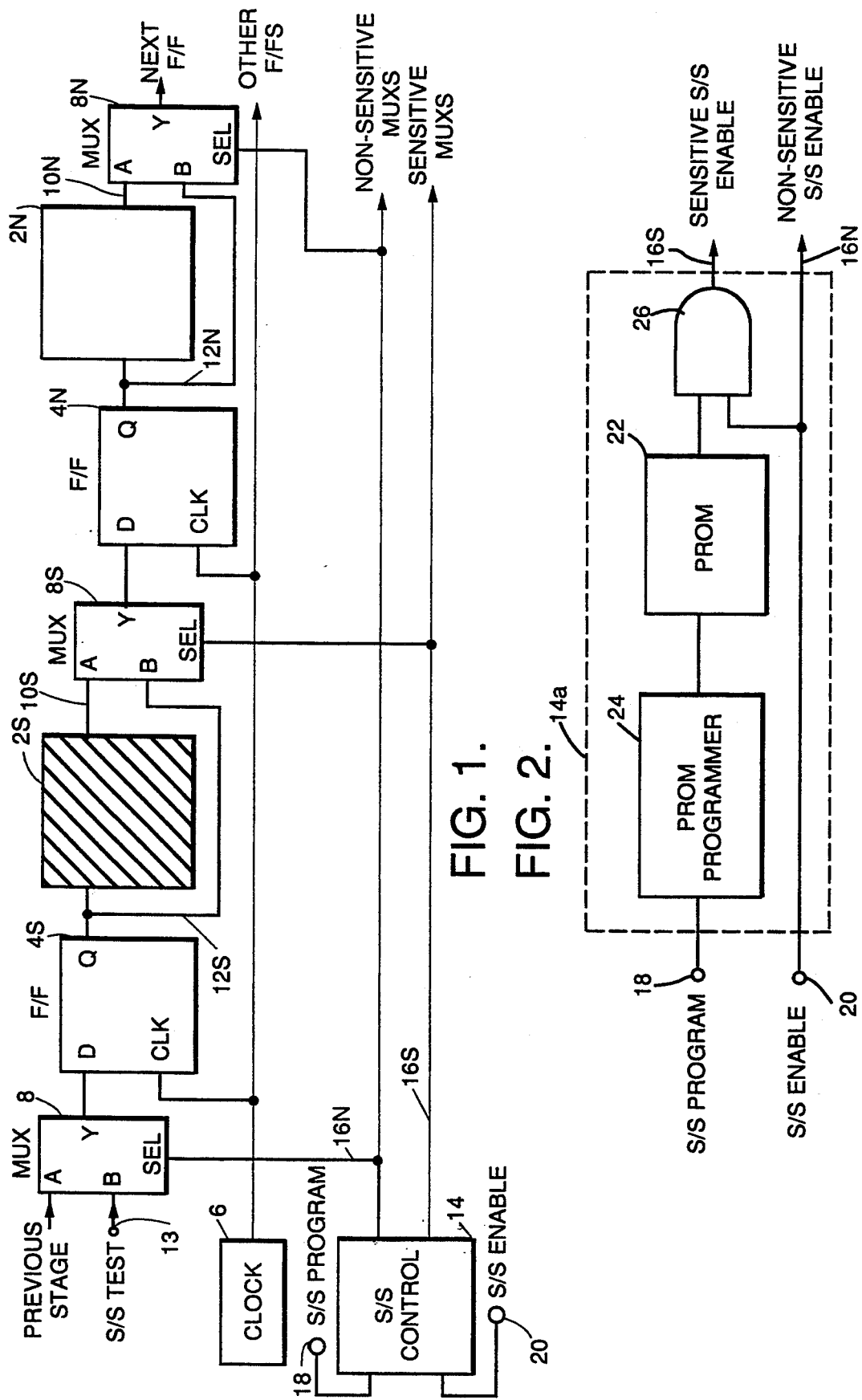
FIG. 1 is a block diagram of a portion of an overall IC with an irreversible set/scan inhibit function for sensitive subcircuits in accordance with the invention.
FIG. 2 is a block diagram of a set/scan control function for the circuit of FIG. 1.

A block diagram that illustrates one embodiment of the invention, in which a number of sensitive subcircuits are jointly inhibited from receiving a set/scan test signal, is illustrated in FIG. 1. A portion of an IC is represented, including a sensitive subcircuit 2S and a non-sensitive subcircuit 2N. Examples of sensitive subcircuits could include a combination of simple logic gates, a ROM that maps inputs into different outputs, or a more complex function that includes its own flip-flops and associated logic. Signals are supplied to each of the subcircuits by respective gates, preferably in the form of flip-flop circuits 4S and 4N. Each flip-flop circuit responds to a clock 6 to pass an input signal to its respective subcircuit, and blocks the input signal in the absence of a clock signal.

Each subcircuit also has an associated switch, preferably in the form of multiplexers 8S and 8N for subcircuits 2S and 2N, respectively, which selects between an active mode in which the input signal for its subcircuit is allowed to proceed to that subcircuit, and an inhibit mode in which the input signal bypasses the subcircuit. For this purpose each multiplexer includes a pair of alternate signal inputs. One of the inputs is connected by an input line 10S (for subcircuit 2S) or 10N (for subcircuit 2N) to receive the output from its respective subcircuit, and the other is connected by a bypass line 12S (for subcircuit or 12N (for subcircuit 2N) to the input for its respective subcircuit, thus bypassing the subcircuit. For normal set/scan testing, the multiplexers are set to bypass each of the subcircuits except for the particular subcircuit to be tested, thereby routing the set/scan test signal directly to that subcircuit and obtaining a direct output pattern from the tested subcircuit. A set/scan test input terminal 13 is illustrated as an input to the multiplexer 8 for the subcircuit (not shown) preceding subcircuit 2S; in practice the set/scan input terminal would be connected to the first subcircuit in the set/scan chain. In a normal operating mode, the multiplexers are all connected to the outputs of their respective subcircuits, thus allowing each subcircuit to perform its intended function within the IC.

In accordance with the invention, a special set/scan control circuit 14 is provided to inhibit set/scan access to the sensitive subcircuits, while permitting set/scan access to the other subcircuits. The set/scan control circuit 14 generates two separate set/scan enable signals, one over line 16S for the sensitive subcircuits and the over line 16N for the non-sensitive subcircuits, as determined by an external programming input 18. A second input 20 is provided to the set/scan control circuit 14 to set the circuit to an enabled state when set/scan testing is desired. When the programming input 18 is inactive and a set/scan enable signal is applied to input 20, both of the output lines 16S and 16N are enabled, allowing both the sensitive and non-sensitive circuits to be included in the set/scan test chain. Once the program input 18 has been activated, only the non-sensitive subcircuits can be set to known values and read back out in a set/scan test mode; the sensitive subcircuits are bypassed and thus cannot be set to known values or read out of the device. A copyist is thereby denied access to the sensitive subcircuits and prevented from determining their functions or designs.

The sensitive control output line 16S of FIG. 1 is connected in common to the "select" input of each multiplexer 8S for the sensitive subcircuits 2S, while the non-sensitive control output line 16N is connected in common to the "select" input for multiplexers 8N associated with each of the non-sensitive subcircuits 2N. All of the multiplexers 8S for the sensitive subcircuits are thus set by the set/scan control circuit to a common state, as are all of the multiplexers 8N for the non-sensitive subcircuits. To perform normal set/scan testing of the non-sensitive subcircuits, the clocking of data through the overall circuit from subcircuit-to-subcircuit is coordinated with an alternation of the set/scan control output for the non-sensitive subcircuits (by an alternation of the enable input 20 to the set/scan control circuit 14). When the data reaches a particular multiplexer, all of the non-sensitive multiplexers are set to the desired state for the multiplexer at the data location. Thus, the multiplexer for the non-sensitive subcircuit to be tested is set to the output line 10N for its associated subcircuit, while the multiplexers for the other non-sensitive subcircuits are set to bypass those subcircuits when the input data reaches them.

Although all of the non-sensitive multiplexers are switched in common, their alternation is controlled so that each multiplexer is in its desired state when the input data reaches it. The multiplexers 8S for the sensitive subcircuits, on the other hand, respond to a program input 18 by bypassing their respective subcircuits 2S, regardless of the set/scan enable input 20. The sensitive subcircuits can thus be programmed to initially allow for their set/ scan testing, such as during manufacturing, and afterwards latched to a bypass state to prevent reverse engineering via a set/scan analysis.

A number of methods can be used to remove the sensitive subcircuits from the set/scan chain. One approach is to include a programmable storage cell within the device that can be programmed to remove the sensitive subcircuits. Such a scheme is illustrated in FIG. 2, in which a set/scan control block 14a (indicated by dashed lines) is implemented with a programmable read only memory (PROM) cell 22 in the form of a fusible-link PROM cell. A PROM programmer cell 24 controls the status of the PROM cell 22 in response to a program signal at program input 18. The PROM cell 22 is initially fabricated in the enabling state, and can be programmed by the application of a logic high signal at the program input 18 to the disabling state; this can be done for example by the manufacturer upon completion of device testing. Control over the set/scan function for the sensitive subcircuits is achieved by connecting the output of PROM cell 22 and the set/scan enable input 20 to respective inputs of an AND gate 26, with the output of the AND gate connected to the set/scan control line 16S for the sensitive subcircuits; the set/scan enable input 20 is also connected directly to the control line 16N for the non-sensitive subcircuits.

In the embodiment of FIG. 2, the set/scan control 14a cannot be changed back to the enabling state by a copyist once it has been placed in a disabling state. While various types of fuses or irreversible switches could be used for this purpose, a fusible-link PROM cell is a convenient way to implement the latch-out in a monolithic IC. Once the programming input 18 is made active, the PROM cell 22 is erased and permanently prevents the set/scan enable signal at input 20 from reaching the sensitive subcircuits. Other control elements that can be reprogrammed from a disabling back to an enabling state and then erased again to allow post-manufacturing set/scan testing of the sensitive subcircuits, such as electrically or ultraviolet erasable PROMs, could also be used but the level of protection would not be as great. Similarly, a laser can be used to interrupt the set/scan enable signal; in this case the PROM programmer 24 and PROM 22 are not necessary.

Figures 3, 4:
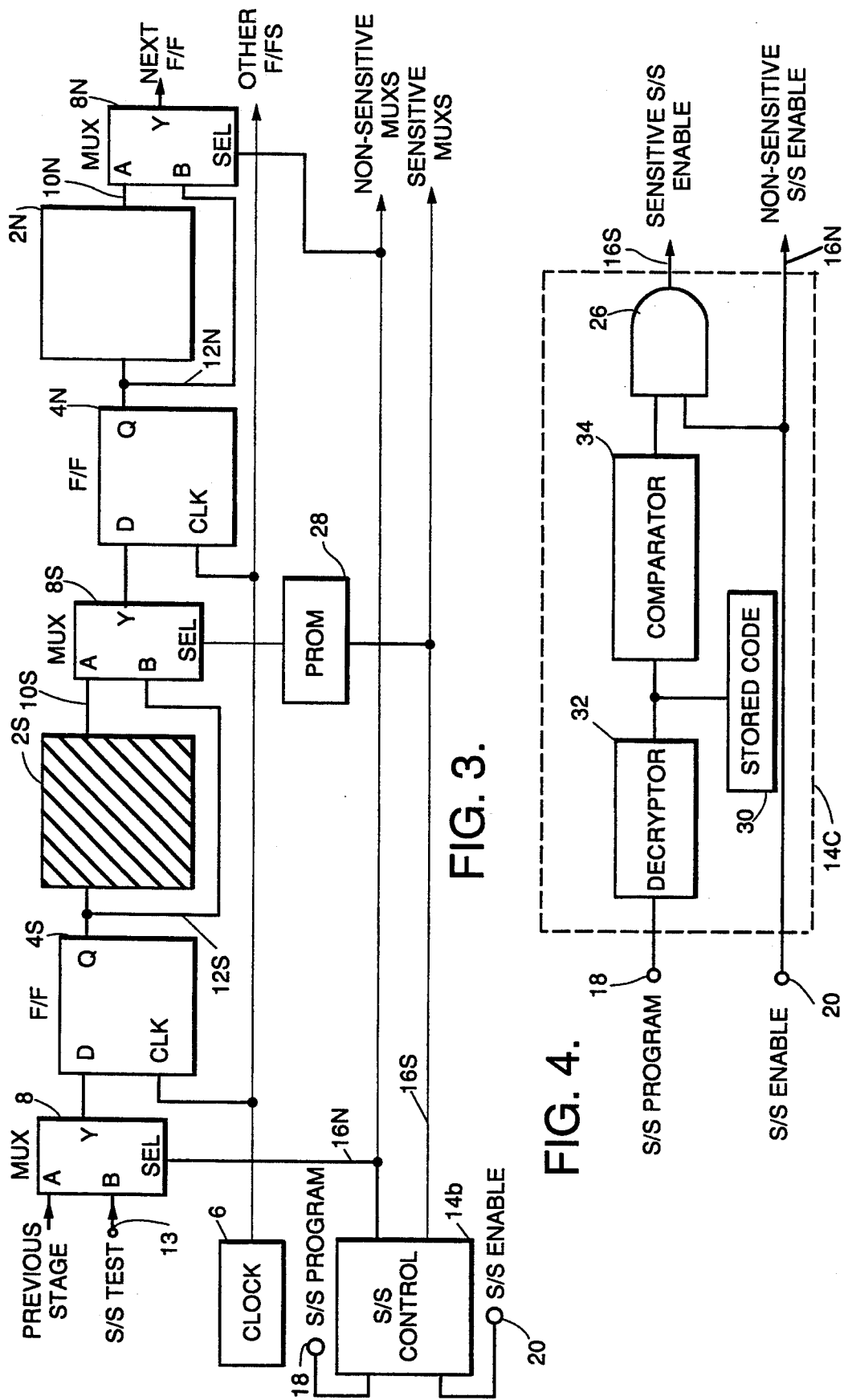
FIG. 3 is a block diagram of a circuit similar to FIG. 1, but with a distributed mechanism for the irreversible set/scan inhibit function.
FIG. 4 is a block diagram of a set/scan access control for a reversible set/scan inhibit function.

In the embodiment of FIG. 2 a single fusible-link PROM 22 is provided within the set/scan control 14a for all of the sensitive subcircuits. To make it more difficult for a reverse engineer to recognize the PROM function through visual inspection, separate PROMs could be distributed through the IC, one for each sensitive subcircuit. Such a configuration is illustrated in FIG. 3, in which PROM 28 is shown connected between the sensitive subcircuit enable line 16S and the control input for multiplexer 8S; similar PROMs would be provided for each of the other sensitive subcircuits. The set/scan control circuit 14b is similar to FIG. 2, but without the central PROM 22. A set/scan disable signal received at program input 18 is transmitted to each of the distributed PROMs 28, which are latched out to permanently inhibit set/scan access to their respective sensitive subcircuits.

Somewhat more complex implementations of the invention can also be used when it is required that the sensitive subcircuit be testable after the device has been manufactured, tested and delivered to a customer. Such situations can arise, for example, when built-in test requirements dictate that fault isolation be carried to the device level, or if the manufacturer wishes to determine the fault modes of devices that have failed in the field. In such situations the sensitive subcircuits should not be permanently removed from the set/scan test chain, but access to them should be made sufficiently difficult that a copyist would not be able to determine the proper input conditions to enable them. Externally supplied control or access codes can be used to provide this capability, and can be made substantially tamper proof by changing them each time they are used. Encryption or one-way hash functions can be used to meet such requirements.

The use of an encryption function is illustrated in FIG. 4. A fixed pattern or stored code 30 is encrypted by the device's manufacturer and held in the set/scan control 14c as a stored code 30. A decryptor 32 decrypts access codes applied to the set/scan program input 18 and furnishes the decrypted code to a comparator 34, which compares it with the stored code 30. If the compared patterns match, the comparator 34 delivers a signal to AND gate 26 that allows a set/scan enable signal at input 20 to be passed on to the sensitive subcircuits, as well as to the non-sensitive subcircuits. Particular encryption/decryption techniques are well known, and do not by themselves form a part of this invention.

Figure 5:
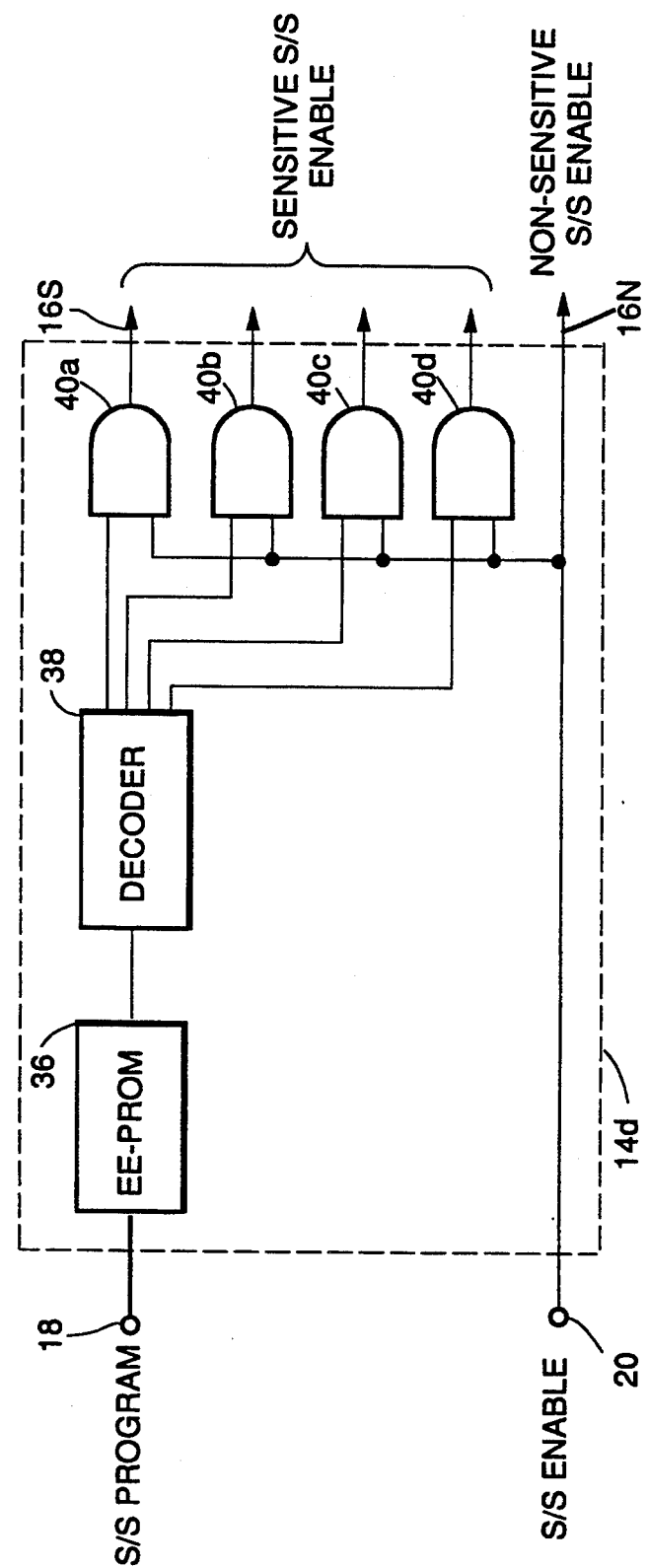
FIG. 5 is a block diagram of a set/scan control for an embodiment of the invention in which the particular subcircuits for which set/scan access is inhibited is programmable.

Another embodiment of the invention that is even more difficult to reverse engineer is illustrated in FIG. 5. In this case the set scan control 14d includes an electrically erasable or ultraviolet erasable PROM (EE-PROM or UV-PROM) 36 that includes an address for each sensitive subcircuit. A program signal is applied at program input 18 that includes a sequential bit sequence to enable or inhibit each sensitive subcircuit address in the EE-PROM 36. The contents of the EE-PROM 36 are decoded by a decoder 38 and applied to respective AND gates 40a, 40b, 40c, 40d for each of the sensitive subcircuits to control the access of a set/scan enable signal at input 20 to the multiplexers for these subcircuits; the set/scan enable 20 is connected to the second inputs for each of the AND gates.

The contents of the EE-PROM 36 determine whether or not the set/scan enable signal reaches the individual sensitive subcircuits. The protected circuit will therefore be completely testable only when a program signal with the exact correct sequence is applied to program input 18; any other sequence will result in one or more sensitive subcircuits being untestable and therefore unaccessible for reverse engineering. Due to the potentially large number of possible combinations that a reverse engineer would have to try, and the difficulty in interpreting the results, access to the sensitive subcircuits is effectively inhibited while still allowing the device's manufacturer and authorized user full access to them. After set/scan testing has been completed, the EE-PROM 36 can be erased and reprogrammed such that only the non-sensitive subcircuits are included in subsequent set/scan testing. Since a copyist cannot determine the previous contents of the EE-PROM, he would not be able to properly program it to gain access to the sensitive subcircuits.

While the set/scan enable input 20 shown in FIG. 5 is connected directly to a single non-sensitive subcircuit enable line 16N, separate AND gates could also be provided for each of the non-sensitive subcircuits and controlled by the EE-PROM 36 to further confuse a reverse engineer. If the EE-PROM is made sufficiently large, exhaustive search techniques will become infeasible because the copyist would not be able to determine whether a change in an input-output pair is due to the exclusion of a non-sensitive subcircuit, or the inclusion of a sensitive one.

The preferred implementation of the invention depends upon the particular system and the technical sophistication of the assumed reverse engineer. The implementation of FIGS. 1 and 2 is the lowest cost solution, but it is also less secure in the sense that a reverse engineer might be able to bypass the PROM cell with a probe station or a laser; the implementation of FIG. 3 reduces this possibility because of the distribution of PROMs throughout the circuit. The approach of FIG. 4 makes it even more difficult for the reverse engineer to bypass, due to the complexity of determining the encrypted version of the stored code. The FIG. 5 approach may be the most secure in the sense that a reverse engineer would need to locate all of the enabling AND gates to bypass them. In a typical circuit of average complexity, this means that a few hundred enabling AND gates would have to be identified out of tens of thousands. If the EE-PROM is made sufficiently large, it would also be very time consuming to try all possible combinations, and even then it would be very difficult for the reverse engineer to interpret the results.

FIG. 6 illustrates a typical application for the invention. In this example the algorithm 42 of an encryption element 44 is considered to be the sensitive element, although the encryption function could be replaced by other sensitive elements such as a digital correlator, protocol generator for cellular radios, or radar signature analysis algorithm for aircraft identification. The sensitive circuitry is included within the encryption element 44, and includes the algorithm 42 and a random number generator 46, as well as the contents of a ROM 48 and RAM 49 associated with the algorithm. The design of a system control unit 50 that includes a central processing unit 52 and associated ROM 54 and RAM 56 are not considered to be sensitive. The set/scan control section 14 includes an array of EE-PROM cells 58 that can be programmed via externally available pins on the package.

After fabrication, the EE-PROM 58 is programmed to include the subcircuits within the encryption element 44 in the set/scan test chain. Therefore, all flip-flops within the algorithm and random number generator, and each cell of RAM 49, can be written into a known state by an externally supplied test pattern and then read out for analysis. Similarly, each location in ROM 48 can be addressed and its contents read out for verification. When testing has been completed, the EE-PROM is reprogrammed to exclude the encryption element 44 from the set/scan chain, as indicated by dashed line 60 in which the set/scan input data is diverted away from and bypasses the encryption element. Since evidence of the previous program no longer exists within the device, a copyist will not be able to gain access to the sensitive subcircuits.

The invention provides the manufacturer with complete controllability and observability during device fabrication, while restricting access to the sensitive elements once the device is delivered. Copyists are therefore prevented from exploiting the set/scan capabilities to recover design details required for the production of unauthorized copies. The device can be made even more secure with the addition of the use control and design protection features of the Ozdemir et al. U.S. Pat. No. 4,766,516.

Several different embodiments of circuit architectures that permit set/scan testing and yet protect the circuit from reverse engineering via the set/scan capability have thus been shown and described. Since numerous additional embodiments and alternate designs will occur to those skilled in the art, it is intended that the invention be limited only in terms of the appended claims.

We claim:

1. An electrical circuit having a plurality of subcircuits and a set-scan test input for testing said subcircuits in a set/scan test mode, some of said subcircuits being sensitive subcircuits protected from reverse engineering, wherein the improvement comprises:
   selectable means, coupled to at least some of said sensitive circuits, for inhibiting set/scan test access to said at least some of said sensitive subcircuits, and
   means for actuating said selectable means, coupled between said subcircuits and said selectable means, to inhibit set/scan access to said sensitive subcircuits while permitting set/scan access to the other subcircuits.

2. The electrical circuit of claim 1, wherein said actuating means includes means for responding to an applied control signal to actuate said selectable means.

3. The electrical circuit of claim 2, wherein said actuating means includes means further includes means for irreversibly actuating, in response to an applied control signal, said selectable means from an initially non-actuated state.

4. The electrical circuit of claim 2, wherein said actuating means includes means for responding to the application of a predetermined access code to de-actuate said set/scan inhibiting means after it has been actuated.

5. The electrical circuit of claim 4, wherein said actuating means includes means for storing an access code reference, means for decrypting an applied encrypted access code, and means, coupled between said storing means and said decrypting means, for comparing the decrypted code with said reference code to deactuate said selectable means in response to the compared codes matching.

6. The electrical circuit of claim 2, wherein said actuating means includes means for programming, coupled between the applied control signal and the sensitive subcircuits, the sensitive subcircuits for which set/scan access in inhibited.

7. The electrical circuit of claim 6, wherein said programming means comprises erasable and reprogrammable means for erasably and reprogrammably programming which of the sensitive subcircuits is to be set/scan inhibited.

8. The electrical circuit of claim 1, said actuating means including a common line for transmitting an actuating signal to a selectable means for said sensitive subcircuits.

9. The electrical circuit of claim 8, said actuating means including means for latching said set/scan inhibit means in an actuated state.

10. The electrical circuit of claim 9, wherein separate latching means are distributed to the set/scan inhibit means for each of said sensitive subcircuits.

11. The electrical circuit of claim 8, further comprising means for clocking a set/scan test signal among said subcircuits, and means for applying an actuating signal to said common line in synchronism with the clocking of said set/scan test signal to actuate the set/scan inhibit means for desired sensitive subcircuits when said set/scan test signal is present at said subcircuits.

12. The electrical circuit of claim 1, said selectable means including means for inhibiting set/scan access to each of said sensitive subcircuits, and said actuating means includes programmable means for actuating the set/scan inhibit means only for programmed sensitive subcircuits.

13. The electrical circuit of claim 12, wherein said means for inhibiting set/scan access to said sensitive subcircuits comprises respective bypass circuits bypassing said sensitive subcircuits, and means for diverting a set/scan test signal away from said subcircuits to their respective bypass circuits.

14. An electrical circuit having a plurality of interconnected subcircuits, some of which are sensitive subcircuits protected from reverse engineering, a set/scan test input for testing said subcircuits in a set/scan test mode, respective bypass circuits for bypassing said subcircuits, respective switches for steering a set/scan test signal between a subcircuit and the bypass circuit for said subcircuit, and a set/scan control means for controlling the operation of said switches during a normal set/scan test, wherein the improvement comprises access control means coupled between the set/scan control means and the switches for said sensitive subcircuits to control the operation of said switches and thereby the access of set/scan test signals to said sensitive subcircuits, and selectable means, coupled to said access control means, for operating said access control means to convert said control means from an initial state enabling the access of set/scan signals to said sensitive subcircuits, to a secure state in which said access control means operates the switches for said sensitive subcircuits to override said set/scan control means and inhibit the access of set/scan test signals to at least some of said sensitive subcircuits.

15. The electrical circuit of claim 14, said access control means including means for irreversibly converting from said initial state to said secure state.

16. The electrical circuit of claim 15, said access control means comprising a fusible link PROM (programmable read only memory) cell, and said selectable access control operating means comprising a programming cell connected to program said fusible link PROM.

17. The electrical circuit of claim 14, said selectable access control operating means including means for decrypting an applied encrypted access code, and said access control means comprising means for comparing the decrypted code with a reference code and, in response to the compared codes matching, converting from said secure state to an enabling state in which set/scan access to said sensitive subcircuits is enabled.

18. The electrical circuit of claim 14, further comprising a common sensitive transmission line coupled between the switches and said sensitive subcircuits, said access control means comprising means for responding to the joint pressure of set/scan enable signals from said set/scan control means and from said selectable access control operating means to provide set/scan enable switch signals along said common sensitive transmission line to the switches for said sensitive subcircuits.

19. The electrical circuit of claim 18, further comprising a common non-sensitive transmission line coupled between the switches and said non-sensitive subcircuits, said set/scan control means comprising means for providing set/scan enable switch signals along said common non-sensitive transmission line to the switches for each of the non-sensitive circuits.

20. The electrical circuits of claim 14, further comprising a sensitive transmission line for each of the switches and said sensitive subcircuits, said access control means comprising means for responding to the joint pressure of set/scan enable signals from said set/scan control means and from said selectable access control operating means to provide set/scan enable switch signals along said respective transmission lines to the switches for said sensitive subcircuits.

21. The electrical circuit of claim 14, said access control means comprising means responsive to an enable signal from said selectable access control operating means for converting from said secure state to an enabling state in which set/scan access to said sensitive subcircuits is enabled.

22. The electrical circuit of claim 21, said access control means comprising an erasable PROM (programmable read only memory) cell storing the addresses of said sensitive subcircuits.

23. A method of protecting an electric circuit that includes sensitive subcircuits protected from reverse engineering and a set/scan test capability from reverse engineering said sensitive subcircuits using the set/scan test capability, comprising the steps of:

initially providing a set/scan test access to said sensitive subcircuits in said circuit; and thereafter inhibiting set/scan test access to said sensitive subcircuits.

24. The method of claim 23, further comprising the step of performing a set/scan test of said circuit, including said sensitive subcircuits, prior to inhibiting set/scan test access to said sensitive subcircuits.

25. The method of claim 24, wherein said step of set/scan test access to said sensitive subcircuits includes irreversibly inhibiting set/scan test access to said sensitive subcircuits.

26. The method of claim 24, wherein said step of inhibiting set/scan test access to said sensitive subcircuits includes reversibly inhibiting set/scan access to said sensitive subcircuits and, further comprising the steps of removing said set/scan inhibition, performing a set/scan test of said circuit including said sensitive subcircuits, and thereafter reinstating said set/scan inhibition for said sensitive subcircuits.

27. The method of claim 26, wherein said set/scan inhibition is removed by storing an access code in said circuit, applying an access code to said circuit, and removing said inhibition in response to said stored and applied access codes matching.

* * * * *